(12) United States Patent
Iwatsuki et al.

(10) Patent No.: US 10,374,454 B2
(45) Date of Patent: Aug. 6, 2019

(54) POWER SUPPLY DEVICE (71) Applicant: SANYO Electric Co., Ltd., Osaka (JP)

(72) Inventors: Nobuo Iwatsuki, Hyogo (JP); Shingo Harada, Osaka (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 183 days.

(21) Appl. No.: 15/512,386

(22) PCT Filed: Sep. 29, 2015

(86) PCT No.: PCT/JP2015/004917
§ 371 (c)(1),
(2) Date: Mar. 17, 2017

(87) PCT Pub. No.: WO2016/072041
PCT Pub. Date: May 12, 2016

(65) Prior Publication Data
US 2017/0279301 A1 Sep. 28, 2017

(30) Foreign Application Priority Data
Nov. 7, 2014 (JP) .................................. 2014-227447

(51) Int. Cl.
*G06F 1/30* (2006.01)
*H01M 2/10* (2006.01)
(Continued)

(52) U.S. Cl.
CPC ............... *H02J 9/061* (2013.01); *G06F 1/30* (2013.01); *H01M 2/10* (2013.01); *H01M 2/1077* (2013.01);
(Continued)

(58) Field of Classification Search
CPC ...... H01M 2/10; H01M 2/34; H01M 2220/10; H01M 2/1077; G06F 1/30; H05K 7/1457; H02J 9/061
See application file for complete search history.

(56) References Cited

U.S. PATENT DOCUMENTS 6,554,640 B1 4/2003 Koike et al.
2012/0034507 A1* 2/2012 Harada ............... B60L 11/1874
429/120

(Continued)

FOREIGN PATENT DOCUMENTS

EP  2 280 436  2/2011
EP  2 693 514  2/2014
(Continued)

OTHER PUBLICATIONS

Extended European Search Report dated Sep. 4, 2017 in related European Patent Application No. 15856553.1.
(Continued)

*Primary Examiner* — Jared Fureman
*Assistant Examiner* — Duc M Pham
(74) *Attorney, Agent, or Firm* — Wenderoth, Lind & Ponack, L.L.P.

(57) ABSTRACT

A power supply device includes outer case, a battery block housed in this outer case and including at least one or more secondary batteries; a circuit board connected to the battery block; and power supply connector connected to output lead that outputs an output current from the battery block. Power supply connector is attached in a floating state to fixed surface of outer case. Furthermore, the circuit board is disposed in parallel to a first direction orthogonal to fixed surface between fixed surface and the battery block. Output (Continued)

lead is disposed in wiring space provided in a lower side or an upper side of the circuit board, and connected to the battery block.

8 Claims, 7 Drawing Sheets

(51) Int. Cl.
  *H01M 2/20* (2006.01)
  *H01M 2/34* (2006.01)
  *H02J 9/06* (2006.01)
  *H05K 7/14* (2006.01)

(52) U.S. Cl.
  CPC ............ *H01M 2/206* (2013.01); *H01M 2/34* (2013.01); *H05K 7/1457* (2013.01); *H01M 2220/10* (2013.01)

(56) References Cited

U.S. PATENT DOCUMENTS

| | | | |
|---|---|---|---|
| 2014/0017531 A1* | 1/2014 | Uehara | H01M 2/1077 429/82 |
| 2014/0308557 A1 | 10/2014 | Ebisawa et al. | |
| 2015/0333303 A1 | 11/2015 | Hachiya et al. | |
| 2015/0349390 A1* | 12/2015 | Aiba | H01M 2/1077 429/90 |
| 2016/0149177 A1* | 5/2016 | Sugeno | H01G 11/10 307/9.1 |

FOREIGN PATENT DOCUMENTS

| | | |
|---|---|---|
| EP | 2 775 548 | 9/2014 |
| JP | 2000-349875 | 12/2000 |
| JP | 2006-294338 | 10/2006 |
| JP | 2011-049151 | 3/2011 |
| WO | 2013/103072 | 7/2013 |
| WO | 2014/073544 | 5/2014 |

OTHER PUBLICATIONS

International Search Report of PCT application No. PCT/JP2015/004917 dated Nov. 10, 2015.

* cited by examiner

POWER SUPPLY DEVICE

This application is a U.S. national stage application of the PCT International Application No. PCT/JP2015/004917 filed on Sep. 29, 2015, which claims the benefit of foreign priority of Japanese patent application 2014-227447 filed on Nov. 7, 2014, the contents all of which are incorporated herein by reference.

TECHNICAL FIELD

The present invention relates to a power supply device incorporating a secondary battery, and particularly to a power supply device that is set in a server rack and is optimal for a power supply for supplying a server with electric power during a power failure.

BACKGROUND ART

A server can be successfully shut down when electric power is supplied from a power supply device during a power failure. A power supply device to be used for this application is put to practical use as an uninterruptible power supply system. The uninterruptible power supply system incorporates a secondary battery that supplies a server with operation power. The uninterruptible power supply system supplies electric power after it detects a power failure until the server completes a shutdown operation. A power supply device to be used for this application needs to supply a server as a load with a large electric power although supplying time is short. Furthermore, not only in the uninterruptible power supply system, but also in power supply devices for supplying a large electric power, for example, a power supply device for a vehicle, it is necessary to increase an electric current capacity of a power supply connector and an output lead connected to the power supply connector.

The power supply connector having a large electric current capacity is required to increase a contact pressure by using a thick metal plate for an elastic contact that is brought into contact with a power line. A power supply connector having a thick metal plate is attached in a floating state, and can be electrically connected to a power line at a load side stably and smoothly. This is because relative displacement between the elastic contact of the power supply connector and the contact at the load side can be absorbed by moving the power supply connector that is in a floating state. This power supply connector achieves characteristics of moving to a position in which power supply connector can be smoothly linked to the load side, and being stably connected to the position.

In order to connect a power supply connector reliably and stably, devices in which the power supply connector is attached in a floating state have been developed (see PTLs 1 to 4).

CITATION LIST

Patent Literature

PTL 1: Japanese Patent Application Unexamined Publication No. 2000-349875
PTL 2: Japanese Patent Application Unexamined Publication No. 2006-294338
PTL 3: International Publication WO No. 2014/073544
PTL 4: International Publication WO No. 2013/103072

SUMMARY OF THE INVENTION

A conventional structure in which a power supply connector is attached in a floating state to an outer case enables the power supply connector to move in a relative position with respect to the outer case and to be connected smoothly. However, the conventional structure has disadvantageous that when an output lead connected to the power supply connector is thick and is not easily bent, the power supply connector cannot move smoothly in a floating state. In particular, since a power supply device of a large electric power uses a thick output lead, it is difficult to bend the output lead smoothly. Consequently, the output lead may hinder the floating state of the power supply connector. Increasing length of the thick output lead makes the output lead to be bent easily. However, a power supply device having a long output lead needs space for housing the long output lead, thus disadvantageously increasing the size of the outer case.

Outer shapes of power supply devices used for various applications are often limited by devices to be connected at a load side. For example, an outer shape of a power supply device to be used for an uninterruptible power supply system of a server is limited to outer shapes capable of being housed in a server rack. Furthermore, even in power supply devices whose outer shapes are not limited, it is extremely important to reduce the outer shape and to increase a capacity with respect to a volume. In particular, since a secondary battery occupies a considerable volume in the power supply device having a large capacity, it is extremely important to reduce redundant space.

The present invention has been developed for the purpose of solving the above-mentioned problems. An important object of the present invention is to provide a power supply device which allows a power supply connector attached in a floating state to move more smoothly and to be electrically connected to a load side reliably and stably without increasing the outer shape.

A power supply device of the present invention includes an outer case, a battery block including at least one or more secondary batteries to be housed in the outer case, a circuit board connected to the battery block, and a power supply connector connected to an output lead that outputs an output current from the battery block. The power supply connector is attached in a floating state to a fixed surface of the outer case. Furthermore, the circuit board is disposed in parallel to a first direction orthogonal to the fixed surface, between the fixed surface and the battery block. The output lead is disposed in wiring space provided in the lower side or the upper side of the circuit board and connected to the battery block.

A power supply device of the present invention allows a power supply connector attached in a floating state to move smoothly and to be electrically connected to a power line at a load side reliably and stably, without increasing an outer shape of an outer case. This is because in the power supply device of the present invention, a power supply connector is attached in a floating state to a fixed surface of the outer case, a circuit board is disposed in parallel to a first direction orthogonal to the fixed surface between the fixed surface and a battery block, and an output lead is disposed in wiring space provided in a lower side or an upper side of the circuit board, and connected to the battery block.

DETAILED DESCRIPTION OF THE PREFERRED EMBODIMENT

Hereinafter, embodiments of the present invention are described with reference to drawings. However, embodiments mentioned below are examples of a power supply device for embodying the technical idea of the present invention, but the present invention is not specified to the below-mentioned power supply device. Furthermore, this description does not specify members shown in Claims to the members of embodiments.

A power supply device of the present invention is set in a server rack and is optimal for use for supplying operation power during a power failure until a server completes a shutdown operation. However, the use of the power supply device is not limited to a device set in a server rack. For example, the power supply device can be used for any other applications in which charge and discharge are carried out with a large output current such as a current of 50 A or more or a current of 100 A or more.

Figure 1:
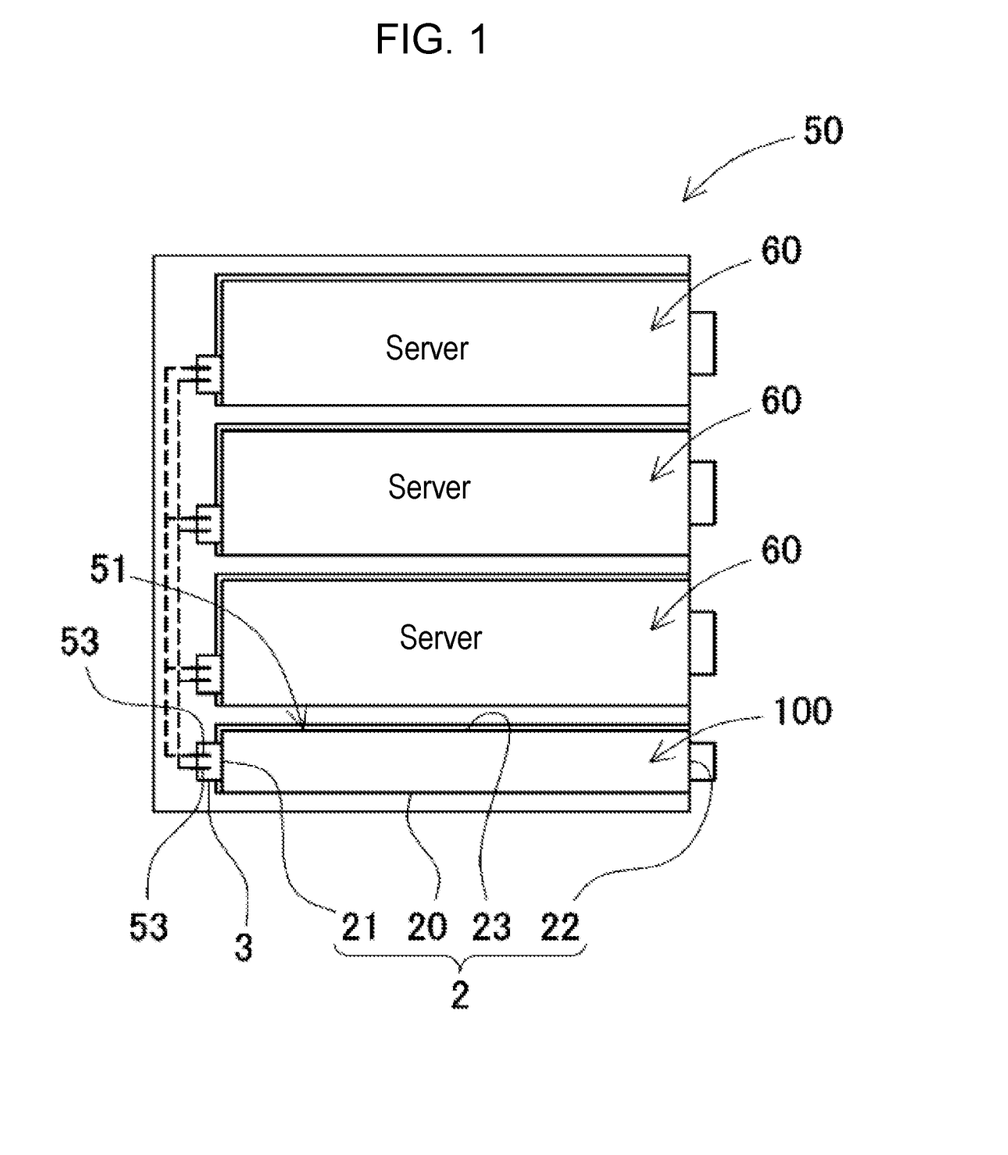
FIG. 1 is a schematic vertical sectional view showing a state in which a power supply device is set in a server rack in accordance with one embodiment of the present invention.

Power supply device 100 shown in a vertical sectional view of FIG. 1 is detachably set in server rack 50 and supplies operation power until server 60 completes a shutdown operation successfully during a power failure. That is to say, power supply device 100 is a power supply device for completing server 60 during a power failure. Server rack 50 shown in the drawing is provided with housing space 51 in which power supply device 100 can be detachably inserted into and out in the horizontal direction. Housing space 51 includes power line 53 for connecting power supply connector 3 of power supply device 100 to be inserted herein. Power line 53 is a metal plates disposed horizontally. Two metal plates are separated into left and right parts, disposed horizontally on the same plane to form positive and negative power lines 53. Note here that two metal plates as power lines 53 may be separated into upper and lower parts, and disposed horizontally in parallel to each other. Two metal plates are insulated from each other and fixed to server rack 50.

In power supply device 100 inserted in housing space 51 of server rack 50, power supply connector 3 is electrically connected to power line 53 and supplies operation power to server 60. As shown in a longitudinal vertical sectional view shown in FIG. 2, a cross-sectional view of FIG. 3, and a block diagram of FIG. 4, power supply device 100 includes outer case 2, battery block 10 housed in outer case 2 and including a plurality of secondary batteries 1, circuit board 4 connected to battery block 10, and power supply connector 3 attached in a floating state to fixed surface 2X of outer case 2 and coupled to an output side of secondary battery 1 via output lead 5.

Figure 4:
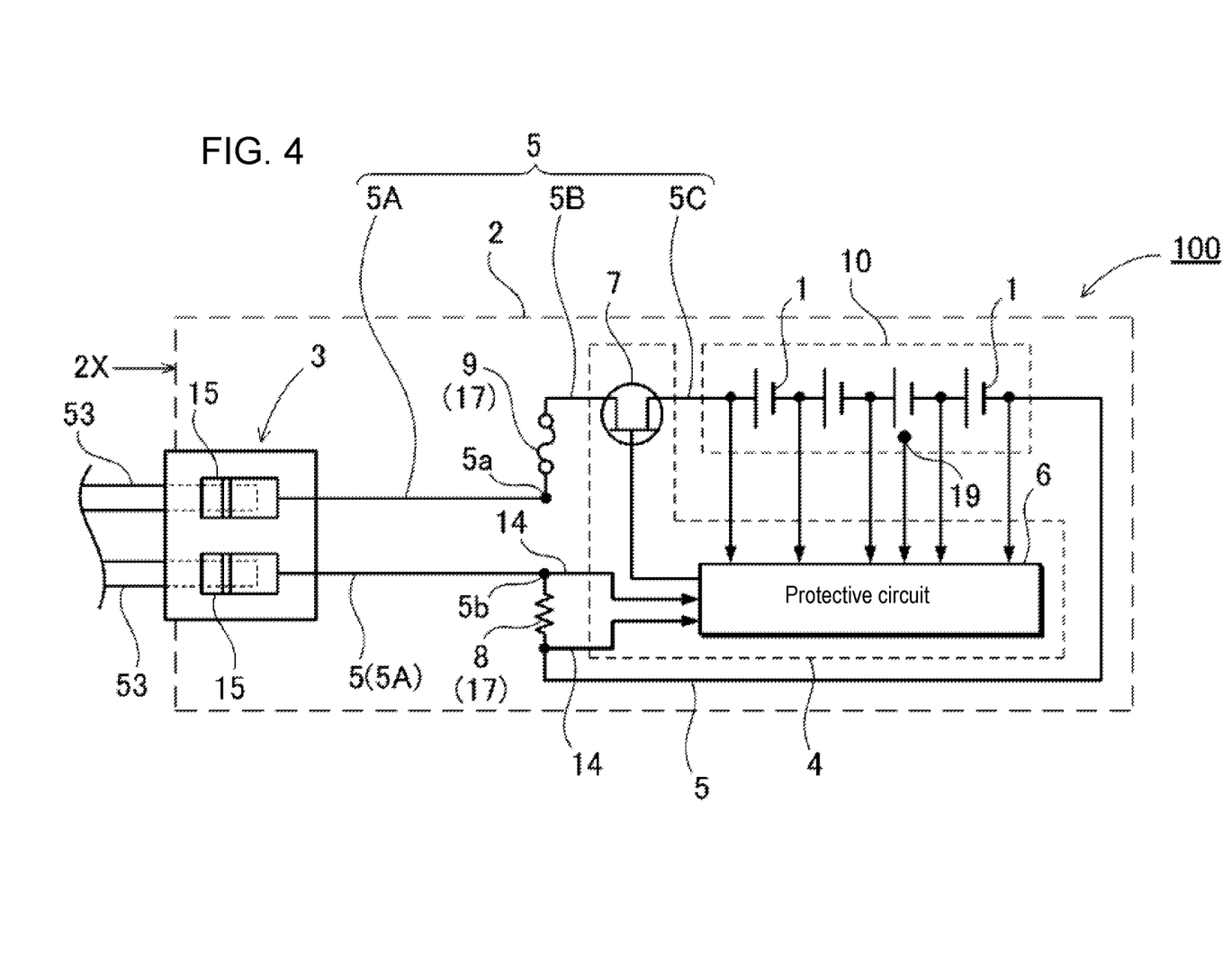
FIG. 4 is a block diagram of the power supply device shown in FIG. 2.

FIG. 4 is a block diagram showing power supply device 100. Power supply device 100 shown in FIG. 4 is provided with battery block 10 including a plurality of secondary batteries 1 connected in series or in parallel, or in series and parallel, semiconductor switching element 7 connected to the output side of battery block 10, protective circuit 6 for controlling on and off of semiconductor switching element 7, and power supply connector 3 for connecting the output side to power line 53.

Protective circuit 6 controls a charge and discharge current for protecting the plurality of secondary batteries 1 constituting battery block 10. Protective circuit 6 detects a voltage, a temperature, and an electric current of secondary batteries 1 constituting battery block 10, and controls the charge and discharge current of battery block 10. Protective circuit 6 controls the on and off of semiconductor switching element 7 so that the voltage and a remaining capacity of secondary battery 1 are within setting ranges. For example, protective circuit 6 switches off semiconductor switching element 7 when a voltage of charged and discharged secondary battery 1 is increased from the maximum voltage or decreased from the minimum voltage, or when the remaining capacity [SOC (%)] of secondary battery 1 is larger than the maximum value or smaller than the minimum value.

In order to detect the remaining capacity [SOC (%)] of secondary battery 1, the power supply device is provided with current detection resistor 8 connected in series to battery block 10. Furthermore, in order to detect a temperature of secondary battery 1, the power supply device is provided with temperature sensor 19 disposed to be thermally bonded to secondary battery 1. Furthermore, in the power supply device, fuse 9 for preventing overcurrent is connected in series to battery block 10. Current detection resistor 8 and fuse 9 are connected to output lead 5, and connected in series to battery block 10. Fuse 9 breaks an electric current of battery block 10 when overcurrent flows in output lead 5. Note here that since fuse 9 and current detection resistor 8 connected to output lead 5 are electronic components disposed for the purpose of protecting secondary battery 1 and power supply device 100, in this description, fuse 9 and current detection resistor 8 are encompassed in protective element 17. Furthermore, in this embodiment, fuse 9 is used as protective element 17 for breaking an electric current of battery block 10. However, as the protective element, a breaker or PTC can also be used.

Semiconductor switching element 7 and protective circuit 6 are mounted on circuit board 4. Protective circuit 6 is configured to detect a voltage or an electric current and switch on and off of semiconductor switching element 7. Current detection resistor 8 and fuse 9 are disposed in outer case 2. Current detection resistor 8 is coupled to protective circuit 6 of circuit board 4 via lead wire 14.

Figure 2:
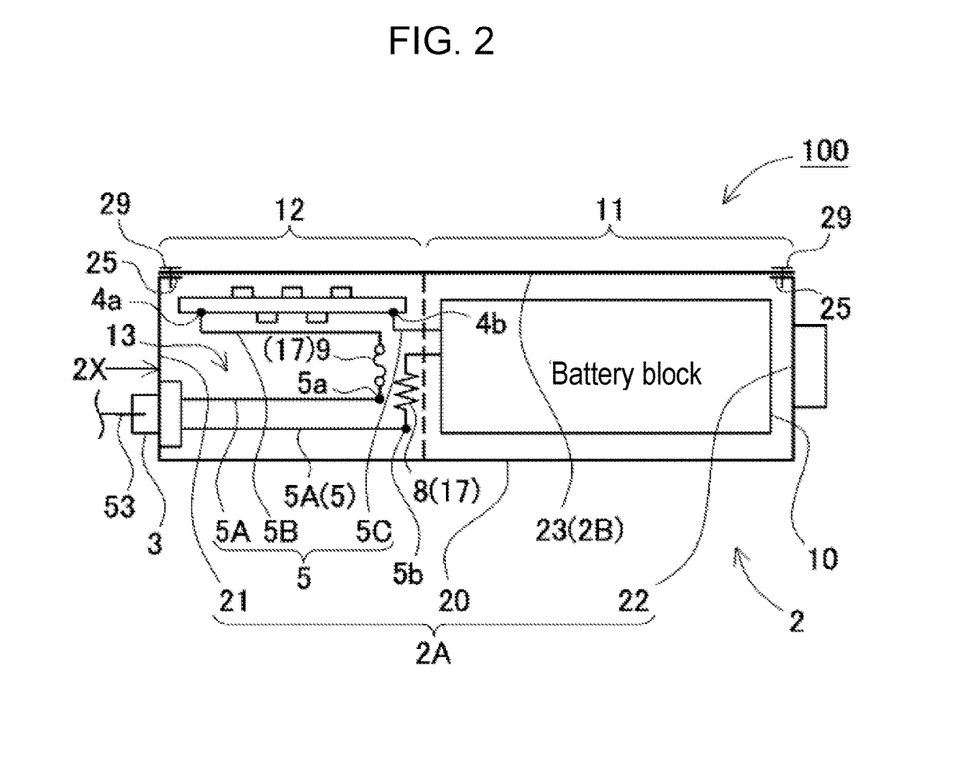
FIG. 2 is a schematic vertical sectional view showing a power supply device taken along the longitudinal direction in accordance with one embodiment of the present invention.
Figure 5:
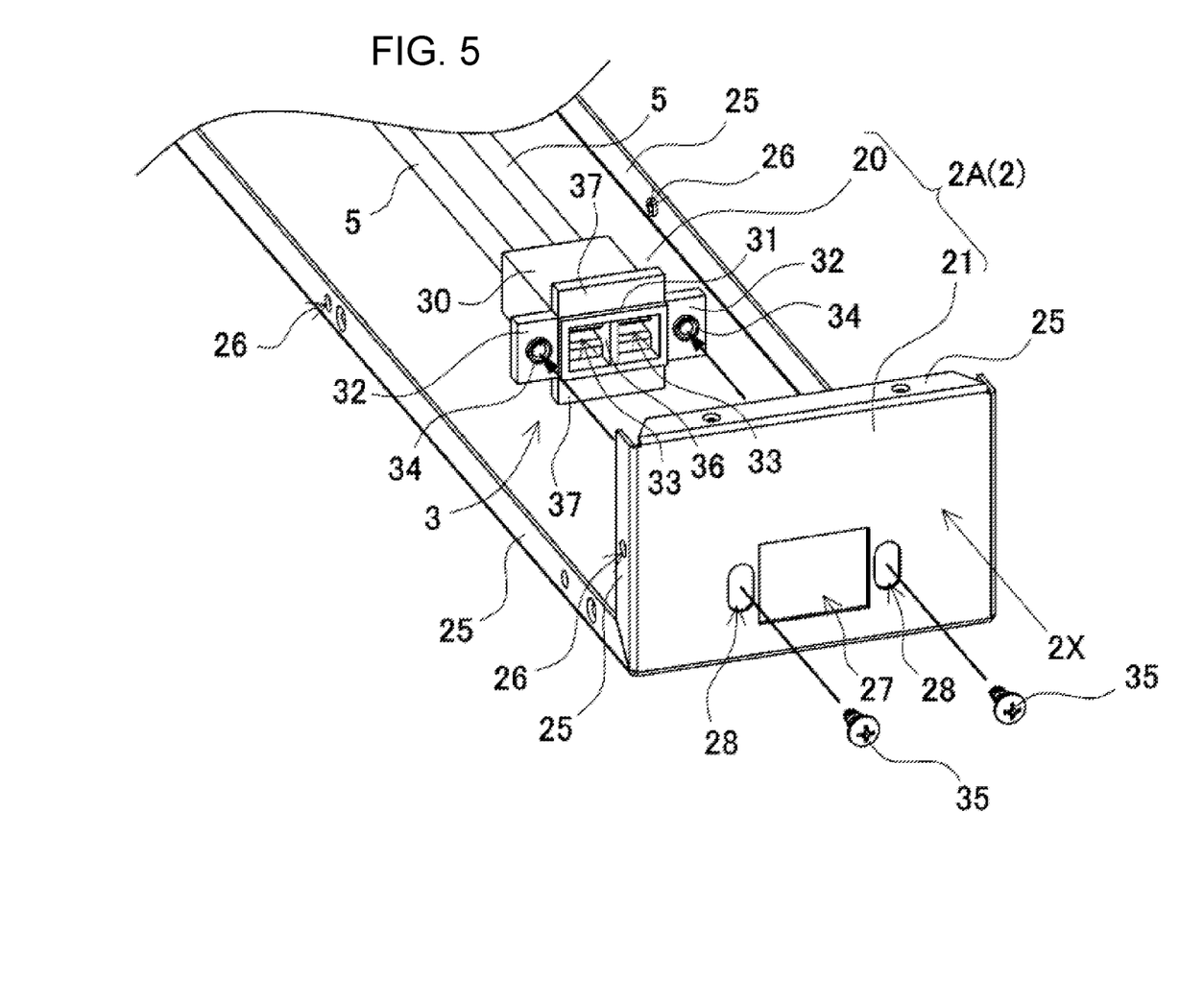
FIG. 5 is an exploded perspective view showing a link structure between a power supply connector and an outer case.

As shown in FIGS. 2 and 5, outer case 2 has an elongated hollow box shape, and is partitioned in the longitudinal direction into battery housing portion 11 for housing a secondary battery and substrate housing portion 12 for housing circuit board 4. As shown in FIG. 1, the entire outer case 2 has an elongated box shape having a length such that front plate 22 is flush with the front surfaces of servers 60 housed in server rack 50 in a state in which outer case 2 is inserted into housing space 51 of server rack 50. As shown in FIG. 2, outer case 2 has back plate 21 as fixed surface 2X to which power supply connector 3 is attached. Substrate housing portion 12 is provided at a back plate 21 side of outer case 2, and battery housing portion 11 is provided at a front plate 22 side. Substrate housing portion 12 is made nearer to the back plate 21 side than battery housing portion 11.

Figure 3:
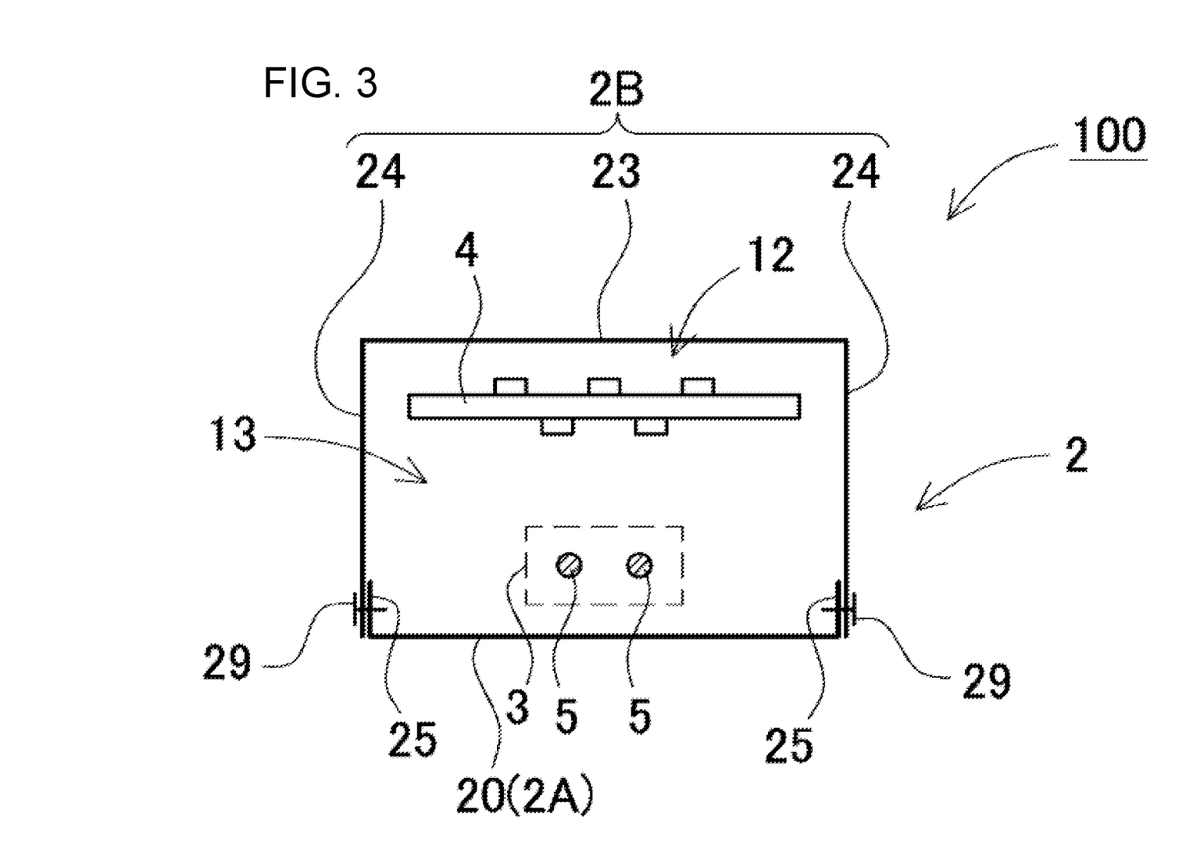
FIG. 3 is a schematic cross-sectional view of the power supply device shown in FIG. 2.

Outer case 2 is produced by bending two metal plates. As shown in FIG. 2, lower-side metal plate 2A is prepared by bending both end portions of an elongated metal plate at the right angle. Thus, back plate 21 and front plate 22 are linked to both ends of bottom plate 20. As shown in FIG. 3, upper-side metal plate 2B is bent such that the cross-sectional shape has a rectangular U-shape, and lateral plates 24, 24 are linked to both sides of upper plate 23. As shown in FIGS. 2, 3 and 5, lower-side metal plate 2A is provided with bending edges 25 by bending both sides of bottom plate 20, both sides and upper end portion of back plate 21 and front plate 22, inwardly. Bending edges 25 are provided with female screw holes 26. Upper-side metal plate 2B is provided with through-holes (not shown) through which set screws 29 to be screwed into female screw holes 26 are inserted. In outer case 2, two metal plates are linked to each other by inserting set screws 29 into through-holes, and screwing set screws 29 into female screw holes 26.

As shown in FIG. 5, back plate 21 as fixed surface 2X is provided with connector window 27 through which power supply connector 3 is inserted and linked in a floating state. Connector window 27 has an inner shape that is larger than the outer shape of power supply connector 3. Power supply connector 3, which is to be inserted into and linked to connector window 27, is attached in a floating state such that power supply connector 3 can move in a direction parallel to the surface of back plate 21. Power supply connector 3 in a floating state is attached such that it can move in a direction parallel to the surface of back plate 21, but cannot move in the direction perpendicular to the surface of back plate 21.

Outer case 2 includes circuit board 4 between back plate 21 as fixed surface 2X and battery block 10. Circuit board 4 is disposed in parallel to a first direction orthogonal to fixed surface 2X. Outer case 2 shown in FIG. 2 includes battery block 10 in battery housing portion 11, and circuit board 4 in substrate housing portion 12. Power supply device 100 shown in FIGS. 2 and 3 includes circuit board 4 horizontally in an upper part of substrate housing portion 12, and wiring space 13 for output lead 5 in a lower side of circuit board 4. Wiring space 13 is provided with output lead 5 whose tip end connected to power supply connector 3.

Output lead 5 is disposed in wiring space 13 in a first direction orthogonal to back plate 21 as fixed surface 2X, that is, extending in the longitudinal direction of outer case 2, and facilitates movement of power supply connector 3 in a floating state. Output lead 5 is disposed in wiring space 13, extending linearly in the longitudinal direction of outer case 2, or in a state of being partially curved or being bent in a loop shape.

Output lead 5 shown in FIGS. 2 and 4 includes first region 5A extending from power supply connector 3 toward battery block 10, and connects a battery block 10 side of first region 5A to circuit board 4 and battery block 10 via protective elements 17 such as fuse 9 and current detection resistor 8. The power supply device shown in the drawings connects two output leads 5 to power supply connector 3. One output lead 5 includes first region 5A connected to power supply connector 3 and extending toward battery block 10, and second region 5B connected to first connection terminal 4a of circuit board 4 and extending toward battery block 10, and, in addition, includes third region 5C for connecting second connection terminal 4b of circuit board 4 to battery block 10. Fuse 9 is connected between first region 5A and second region 5B. The other output lead 5 includes first region 5A extending from power supply connector 3 toward battery block 10. The battery block 10 side of first region 5A is coupled to battery block 10 via current detection resistor 8. Fuse 9 and current detection resistor 8 are disposed in substrate housing portion 12 provided with circuit board 4.

Furthermore, fuse 9 and current detection resistor 8 disposed in substrate housing portion 12 have connection points 5a and 5b with respect to first region 5A nearer to battery block 10 of battery housing portion 11, so that first region 5A of output lead 5 extending from power supply connector 3 becomes longer. That is to say, connection point 5a of fuse 9 and first region 5A, and connection point 5b of current detection resistor 8 and first region 5A are disposed nearer to battery block 10 than back plate 21 as fixed surface 2X (1/2 region and preferably 1/4 region, nearer to battery housing portion 11, in substrate housing portion 12). Herein, protective elements 17 such as fuse 9 and current detection resistor 8 disposed in substrate housing portion 12 cannot always be disposed nearer to battery block 10 because of limitations such as the size of a protective element main body and space of substrate housing portion 12. However, when connection points 5a and 5b with respect to first region 5A are located nearer to battery block 10 than back plate 21 as fixed surface 2X, the length of first region 5A can be sufficiently secured.

In output leads 5 of FIGS. 2 and 4, one output lead 5 to which fuse 9 is connected is coupled to battery block 10 via circuit board 4, and the other output lead 5 to which current detection resistor 8 is connected is connected to battery block 10 not via circuit board 4. In the output leads, the output lead to which the current detection resistor is connected may be coupled to the battery block via the circuit board, the output lead to which the fuse is connected may be connected to the battery block not via the circuit board. Alternatively, both the output lead to which the fuse is connected and the output lead to which the current detection resistor is coupled can be connected to the battery block via the circuit board. Furthermore, the output lead can be connected to the battery block via the series circuit of the fuse and the current detection resistor. In this case, one output lead to which the series circuit of the fuse and the current detection resistor is connected can be connected to the battery block via the circuit board, and the other output lead can be directly connected to the battery block. Alternatively, one output lead to which the series circuit of the fuse and the current detection resistor can be connected to the battery block, and the other output lead can be coupled to the battery block via the circuit board.

As mentioned above, in output lead 5, a battery block 10 side of first region 5A extending from power supply connector 3 toward battery block 10 is connected to protective elements 17 such as fuse 9 and current detection resistor 8 or to circuit board 4, or directly connected to battery block 10. In this way, in a structure in which the battery block 10 side of first region 5A is connected to protective elements 17 such as fuse 9 and current detection resistor 8 or to circuit board 4, or directly connected to battery block 10, output lead 5 extending from power supply connector 3 toward battery block 10 can be fixed to the position distant from power supply connector 3. Consequently, in a structure in which first region 5A can move with a site to which the battery block 10 side of first region 5A is fixed as a fulcrum, power supply connector 3 connected to the tip end of first region 5A can float smoothly and stably.

Output lead 5 is required to have flexibility to be deformed in a state in which power supply connector 3 in a floating state moves upward, downward, leftward and rightward. The flexibility of output lead 5 limits movement of power supply connector 3 in a floating state. An output lead that cannot be deformed makes it substantially impossible to attach the power supply connector to the outer case in a floating state. Output lead 5 disposed in wiring space 13 provided below circuit board 4 can be increased in length to the tip end that is to be connected to power supply connector 3 when first region 5A extending from power supply connector 3 toward battery block 10 is provided. Bending angle of long output lead 5 disposed in wiring space 13 can be made smaller than that of a short output lead in a state in which power supply connector 3 moves upward and downward or leftward and rightward. Since a thick output lead 5 in which a large electric current flows is rigid and cannot be easily bent, the movement of power supply connector 3 in a floating state can be limited. However, when output lead 5 is disposed in wiring space 13 and made to be longer, movement of power supply connector 3 can be facilitated. This is because power supply connector 3 moves, and the bending angle of output lead 5 can be reduced.

Output lead 5 is a lead wire having a cross-sectional area of conductive portion of 8 mm$^2$, in order to increase an electric current capacity. As output lead 5, it is possible to use a lead wire having a cross-sectional area of conductive portion of, for example, 3 mm$^2$ or more, preferably 5 mm$^2$ or more, and more preferably 7 mm$^2$ or more, and 15 mm$^2$ or less. Furthermore, as output lead 5, it is also possible to use a metal plate having a cross-sectional area of conductive portion of, for example, 3 mm$^2$ or more, preferably 5 mm$^2$ or more, and more preferably 7 mm$^2$ or more, and 15 mm$^2$ or less.

Power supply connector 3 is attached in a floating state to back plate 21 as fixed surface 2X of outer case 2. In power supply device 100 of FIG. 1, power supply connector 3 is connected to power line 53 of a metal plate horizontally disposed in the horizontal direction. As shown in the enlarged sectional views of FIG. 6 to 8, power supply connector 3 has elastic contact 15 connected to power line 53 fixed so as to horizontally extend in the horizontal direction in plastic case 30 made of an insulating material. Plastic case 30 of power supply connector 3 shown in FIG. 5 to 8 is unitarily formed with flange portions 32, cover portion 31, and closed part 37. Flange portions 32 are attached to back plate 21 of outer case 2. Cover portion 31 is linked to flange portions 32, inserted into connector window 27 provided in back plate 21, and expressed to the outside of outer case 2. Closed part 37 is configured to close a gap between cover portion 31 and connector window 27. Cover portion 31 is provided at the back-surface side of outer case 2. Cover portion has two lines of guide grooves 33 into which the metal plate power lines 53 are inserted, which are arranged in left and right. The two lines of guide grooves 33 are provided on the same plane such that they extend in the horizontal direction and have a shape into which power line 53 can be inserted. Cover portion 31 shown in FIG. 5 is provided with insulating wall 36 between the two lines of guide grooves 33 so as to insulate the two lines of guide grooves 33 from each other. Closed part 37 has a flange shape extending along the edge at the upper and lower parts of cover portion 31, and protrudes from the upper and lower surfaces of plastic case 30. Closed part 37 is formed so as to close a gap formed between cover portion 31 and connector window 27 in a state in which power supply connector 3 is floating upward and downward.

Elastic contact 15 has a tip end that is pressed by a metal plate of power line 53 and disposed in guide groove 33, a back end protruding as connection terminal 16 of output lead 5 from plastic case 30 to the inside of outer case 2, and a middle portion fixed in plastic case 30. To connection terminal 16 protruding to the inside of outer case 2, output lead 5 is fixed by screwing or by soldering. Output lead 5 has one end fixed to connection terminal 16 and the other end connected to the output side of secondary battery 1, that is, fuse 9 or current detection resistor 8 in FIG. 4. However, in the power supply device, output lead 5 is not necessarily connected to fuse 9 or current detection resistor 8. For example, when semiconductor switching element 7 is connected at the output side of the device, output lead 5 is connected to semiconductor switching element 7.

Power supply connector 3 is attached in a floating state to outer case 2, in which cover portion 31 of plastic case 30 is inserted into connector window 27 of back plate 21, flange portion 32 and closed part 37 are disposed inside back plate 21 of outer case 2. Power supply connector 3 of FIGS. 5 to 8 is attached to outer case 2 such that it moves in the vertical direction but it does not move in the left and right direction. Therefore, connector window 27 is opened in a size, which allows cover portion 31 to move upward and downward. That is to say, connector window 27 has an opening that can have a gap in the upper and lower parts of cover portion 31. This gap defines a stroke in which power supply connector 3 can move upward and downward. Since cover portion 31 can move upward and downward inside connector window 27, a slight gap is provided also between the both sides of cover portion 31 and inside of connector window 27. This is because when the inside of connector window 27 is brought into close contact with the both sides of cover portion 31, power supply connector 3 cannot float upward and downward. This gap is only required to have a size that prevents the both sides of cover portion 31 from being brought into contact with the inside of connector window 27.

Figure 6:
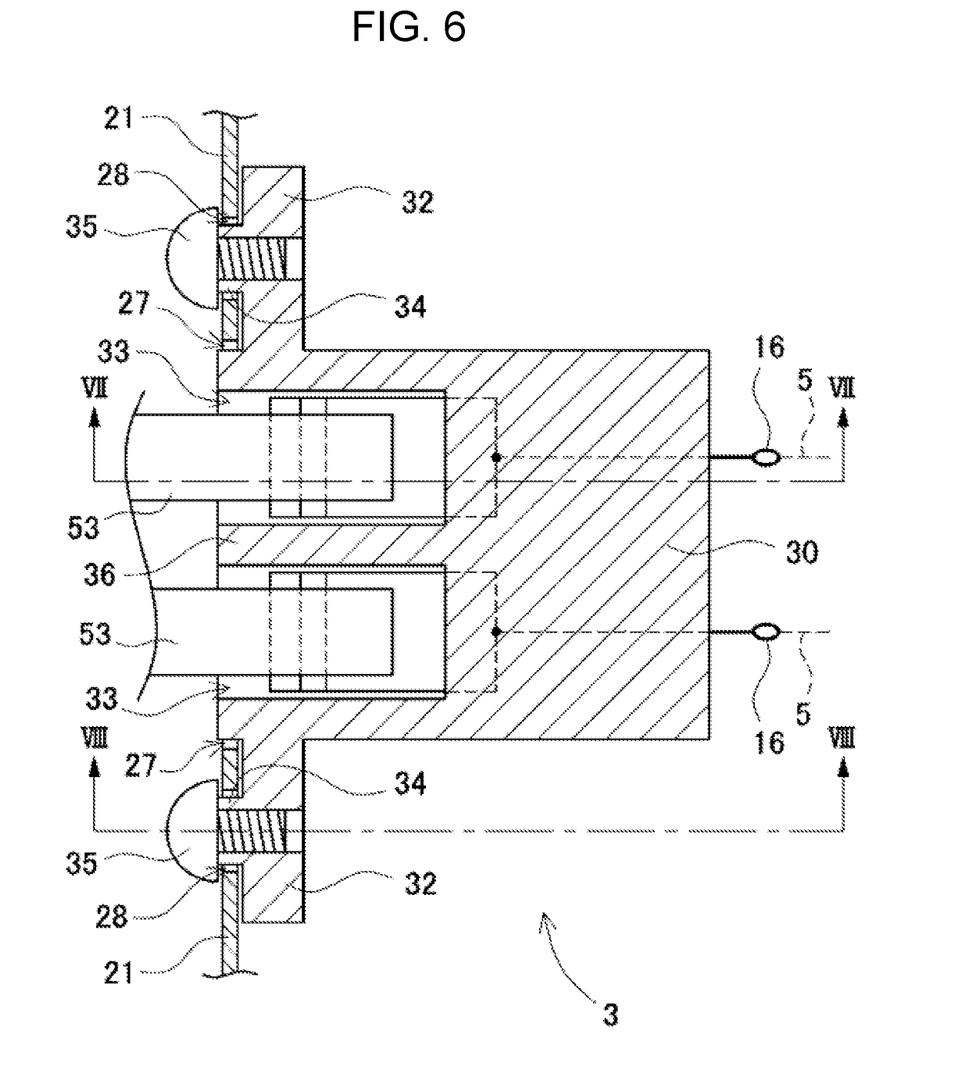
FIG. 6 is a horizontal sectional view showing the link structure between the power supply connector and the outer case.
Figure 8:
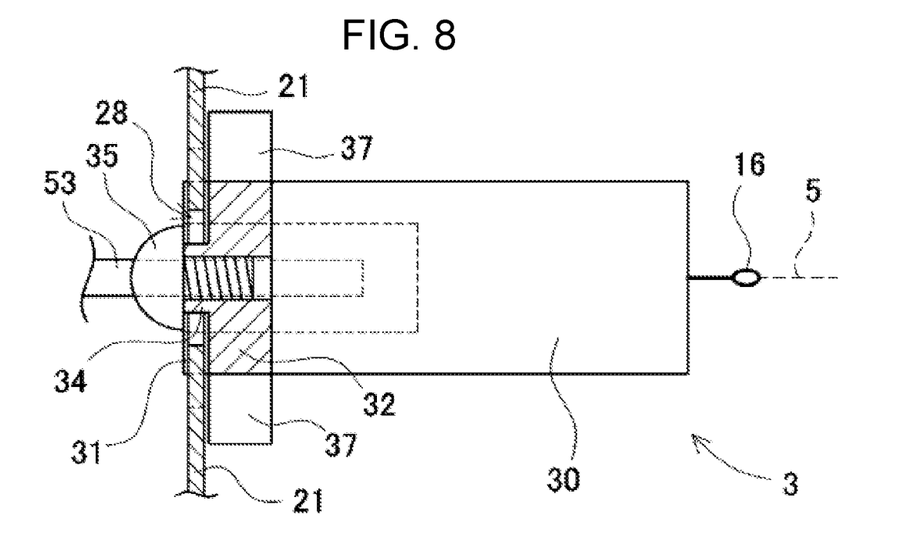
FIG. 8 is a sectional view taken on line VIII-VIII of the power supply connector and the outer case shown in FIG. 6.

Flange portions 32 of plastic case 30 protrude from the both sides of cover portion 31 and are disposed inside of back plate 21. As shown in FIGS. 5, 6 and 8, flange portion 32 is unitarily formed with linking boss 34 configured to be inserted into linking hole 28 of back plate 21. Linking boss 34 has a pipe shape into which set screw 35 is screwed, and thus, power supply connector 3 is attached to back plate 21. Linking boss 34 is inserted into linking hole 28, moving in the vertical direction. In other words, linking hole 28 has an inner shape that allows linking boss 34 to move in the vertical direction. That is to say, linking hole 28 is elongated in the vertical direction. The gap between the upper and lower surfaces of linking boss 34 and the upper and lower inner surfaces of linking hole 28 defines a stroke in which power supply connector 3 can move in the vertical direction. Therefore, this gap, similar to the gap between cover portion 31 and connector window 27, is also an opening that allows power supply connector 3 to move in a predetermined stroke, for example, a stroke of 1 mm to 5 mm each in the upper and lower sides.

Set screw 35 is screwed into linking boss 34 with linking hole 28 inserted therein. A head of set screw 35 has a size that cannot pass through linking hole 28, that is to say, set screw 35 is larger than the width of linking hole 28. Power supply connector 3 is attached in a floating state to back plate 21 in a state in which cover portion 31 is inserted into connector window 27, and linking boss 34 is inserted into linking hole 28 with set screw 35 screwed into linking boss 34. The height at which linking boss 34 protrudes from the surface of flange portion 32 is higher than the thickness of back plate 21. The head of set screw 35 does not press back plate 21 in a state in which set screw 35 is screwed into linking boss 34. Therefore, back plate 21 is disposed but not attached between flange portion 32 and set screw 35 in a state in which set screw 35 is screwed into linking boss 34, and power supply connector 3 is attached in a floating state to back plate 21.

Figure 7:
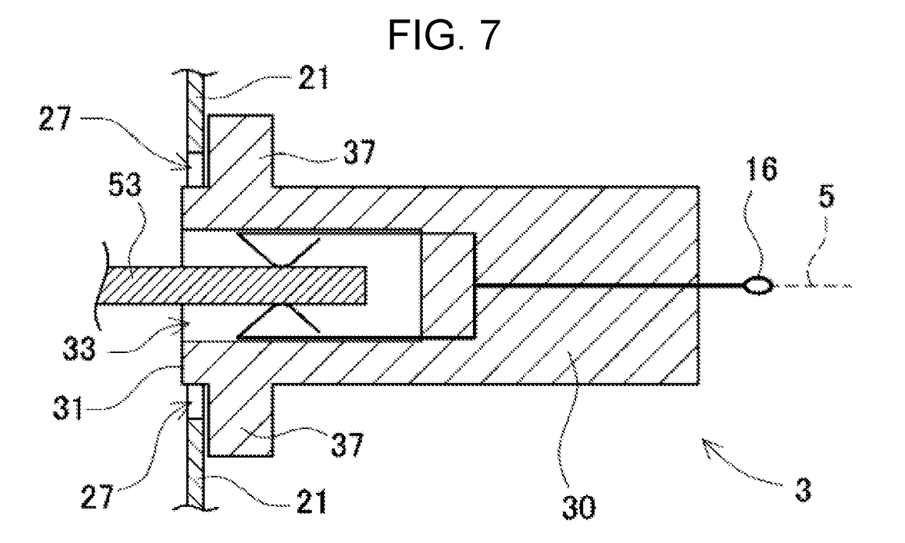
FIG. 7 is a sectional view taken on line VII-VII of the power supply connector and the outer case shown in FIG. 6.

Power supply connector 3 shown in FIGS. 5 and 7 are attached to back plate 21 with flange portions 32 provided to both sides of cover portion 31. However, power supply connector 3 can be attached to back plate 21 with flange portions provided in the upper and lower sides of cover portion 31. Furthermore, power supply connector 3 can be attached to back plate 21 with flange portions provided to four corners of cover portion 31.

Power supply device 100 inserted in server rack 50 of the present invention. In this state, power supply connector 3 is electrically connected reliably to power line 53 of a metal plate fixed to server rack 50 while power supply connector 3 is floating in the vertical direction. This is because power supply connector 3 moves to the ideal position to be electrically connected to power line 53, and allows elastic contact 15 to be electrically connected to power line 53. Power supply device 100 of the present invention is attached to outer case 2, allowing power supply connector 3 to be capable of floating in the vertical direction in order to electrically connect power line 53 that is fixed, extending in the horizontal direction. However, in the structure in which power supply connector 3 is, for example, electrically connected to power line 53 that is fixed in the vertical direction, the power supply device of the present invention is attached to outer case 2, capable of floating in the left and right direction.

Note here that in this exemplary embodiment, power supply connector 3 is attached to back plate 21. However, the power supply connector may be attached to the front plate. Furthermore, the power supply connector may be attached to the left and the right lateral plates. In other words, the substrate housing portion is disposed at a fixed surface side to which the power supply connector is attached, the battery housing portion is disposed at an opposite side to the fixed surface to which the power supply connector is attached, and the substrate housing portion is located near to the fixed surface side than the battery housing portion. This structure can secure wiring space for wiring output leads between the fixed surface to which the power supply connector is attached and the battery block.

Note here that in this exemplary embodiment, battery block 10 has a configuration including a plurality of secondary batteries 1, but battery block may be a configuration including one large secondary battery. Furthermore, in this exemplary embodiment, power supply device 100 includes one battery block 10, but the power supply device may include a plurality of battery blocks connected in series or in parallel.

In the power supply device in this embodiment, output lead 5 can be wired so as to extend in a first direction in wiring space 13.

In the power supply device in this embodiment, output lead 5 is a lead wire having a conductive portion whose cross-sectional area is 3 $mm^2$ or more.

In the power supply device in this embodiment, output lead 5 includes first region 5A extending from power supply connector 3 toward battery block 10. A battery block 10 side of first region 5A can be coupled to battery block 10 via either or both of protective element 17 and circuit board 4.

The power supply device in this embodiment includes fuse 9 connected to output lead 5. Connection point 5a between first region 5A of output lead 5 and fuse 9 can be disposed at a site nearer to battery block 10 than fixed surface 2X.

The power supply device in this embodiment includes current detection resistor 8 connected to output lead 5. Connection point 5b between first region 5A of output lead 5 and current detection resistor 8 can be disposed nearer to battery block 10 than fixed surface 2X.

In the power supply device in this embodiment, semiconductor switching element 7 for turning on and off the output current can be mounted on circuit board 4.

In the power supply device in this embodiment, power supply connector 3 can be attached to fixed surface 2X of outer case 2, capable of floating upward and downward.

In a state in which the power supply device in this embodiment is set in server rack 50, power supply connector 3 can be linked to power line 53 of server rack 50

A power supply device in this embodiment can be suitably used for a power supply device that is set in a server rack and supplies a large electric power, for example, a power supply device that supplies electric power during a power failure. In particular, the power supply device can be suitably used for a power supply device electrically connected to a power line at a load side via a power supply connector.

The invention claimed is:

1. A power supply device comprising:
an outer case;
a battery block housed in the outer case and including at least one or more secondary batteries;
a circuit board connected to the battery block; and
a power supply connector connected to an output lead that outputs an output current from the battery block,
wherein the power supply connector is attached in a floating state to a fixed surface of the outer case,
the circuit board is disposed in parallel to a first direction orthogonal to the fixed surface, between the fixed surface and the battery block,
the output lead is disposed in wiring space provided in a lower side or an upper side of the circuit board, and connected to the battery block, and
the output lead includes a first region extending from the power supply connector toward the battery block, and a battery block side of the first region is coupled to the battery block via at least one of a protective element and the circuit board.

2. The power supply device according to claim 1, wherein the output lead is wired, extending in the first direction, in the wiring space.

3. The power supply device according to claim 1, wherein the output lead is a lead wire having a conductive portion whose cross-sectional area is 3 $mm^2$ or more.

4. The power supply device according to claim 1, wherein the protective element is a fuse connected to the output lead, wherein a connection point of the first region and the fuse is disposed nearer to the battery block than to the fixed surface.

5. The power supply device according to claim 1, further comprising a current detection resistor connected to the output lead, wherein a connection point of the first region and the current detection resistor is disposed nearer to the battery block than to the fixed surface.

6. The power supply device according to claim 1, wherein a semiconductor switching element for turning on and off the output current is mounted on the circuit board.

7. The power supply device according to claim 1, wherein the power supply connector is attached to the fixed surface, capable of floating upward and downward.

8. The power supply device according to claim 1, wherein the power supply connector is linked to a power line of a server rack in a state in which the power supply device is set in the server rack.

* * * * *